(12) United States Patent
Wang et al.

(10) Patent No.: US 11,937,366 B2
(45) Date of Patent: Mar. 19, 2024

(54) CIRCUIT SIGNAL ENHANCEMENT METHOD OF CIRCUIT BOARD AND STRUCTURE THEREOF

(71) Applicant: UNIMICRON TECHNOLOGY CORP., Taoyuan (TW)

(72) Inventors: Tzu Hsuan Wang, Taoyuan (TW); Yu Cheng Lin, New Taipei (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 43 days.

(21) Appl. No.: 17/701,964

(22) Filed: Mar. 23, 2022

(65) Prior Publication Data

US 2023/0239997 A1 Jul. 27, 2023

(30) Foreign Application Priority Data

Jan. 25, 2022 (TW) .................................. 111103117

(51) Int. Cl.
*H05K 1/02* (2006.01)

(52) U.S. Cl.
CPC ........... *H05K 1/024* (2013.01); *H05K 1/0242* (2013.01); *H05K 1/0251* (2013.01);
(Continued)

(58) Field of Classification Search
CPC .... H05K 1/024; H05K 1/0242; H05K 1/0251; H05K 1/0298; H05K 2201/0195;
(Continued)

(56) References Cited

U.S. PATENT DOCUMENTS

| | | | |
|---|---|---|---|
| 5,263,243 A | * | 11/1993 | Taneda ................. H05K 3/4652 156/89.18 |
| 2008/0022518 A1 | * | 1/2008 | Mizutani ................ H05K 1/024 174/250 |

(Continued)

FOREIGN PATENT DOCUMENTS

| | | |
|---|---|---|
| TW | I394248 | 4/2013 |
| TW | I690045 | 4/2020 |

OTHER PUBLICATIONS

English Translation 102460870, Kim et al.; Samsung (Year: 2019).*

*Primary Examiner* — Steven T Sawyer
(74) *Attorney, Agent, or Firm* — WPAT, P.C

(57) ABSTRACT

A method of a circuit signal enhancement of a circuit board comprises the following steps: forming a first substrate body with a first signal transmission circuit layer and a second substrate body with a second signal transmission circuit layer; forming a first signal enhancement circuit layer and a second signal enhancement circuit layer on the first substrate body and the second substrate body; forming a third substrate body with a third signal transmission circuit layer and a fourth substrate body with a fourth signal transmission circuit layer on the carrier; separating the third substrate body and the fourth substrate body from the carrier; combining the first signal transmission circuit layer and the third signal transmission circuit layer through the first signal enhancement circuit layer; and combining the second signal transmission circuit layer and the fourth signal transmission circuit layer through the second signal enhancement circuit layer.

4 Claims, 19 Drawing Sheets

(52) U.S. Cl.
CPC ... *H05K 1/0298* (2013.01); *H05K 2201/0187* (2013.01); *H05K 2201/0195* (2013.01)

(58) Field of Classification Search
CPC .... H05K 2201/0187; H05K 2201/0209; Y10T 29/49126
See application file for complete search history.

(56) References Cited

U.S. PATENT DOCUMENTS

| | | | |
|---|---|---|---|
| 2008/0164057 A1* | 7/2008 | Mori | H05K 3/421 |
| | | | 174/262 |
| 2021/0076492 A1* | 3/2021 | Min | H05K 1/0393 |
| 2022/0132664 A1* | 4/2022 | Shin | H05K 1/115 |
| 2022/0145460 A1* | 5/2022 | Zong | H01L 21/02203 |
| 2022/0293509 A1* | 9/2022 | Manepalli | H01L 24/16 |

* cited by examiner ic layer 82. The third upper circuit layer 83 and the third bottom circuit layer 84 are electrically connected to each other through the second upper circuit layer 79 and the second bottom circuit layer 80. In FIG. 7H, the step forms a first solder mask 85 on the third upper dielectric layer 81, forms a second solder mask 86 on the third bottom dielectric layer 82, encapsulates one part of the third upper circuit layer 83 to expose the other part of the third upper circuit layer 83, and encapsulates one part of the third bottom circuit layer 84 to expose the other part of the third bottom circuit layer 84. Accordingly, the conventional circuit board circuit structure 7 is completed.

CIRCUIT SIGNAL ENHANCEMENT METHOD OF CIRCUIT BOARD AND STRUCTURE THEREOF

CROSS-REFERENCE TO RELATED APPLICATIONS

This application claims the benefit of the filing date of Taiwan Patent Application No. 111103117, filed on Jan. 25, 2022, in the Taiwan Intellectual Property Office, the disclosure of which is incorporated herein in its entirety by reference.

BACKGROUND OF THE INVENTION

1. Field of the Invention

The invention relates to a signal enhancement method and a structure thereof, particularly to a circuit signal enhancement method of a circuit board and a structure thereof.

2. Description of the Related Art

Please refer to FIG. 7A to FIG. 7H. FIG. 7A to FIG. 7H are schematic views of a conventional method for manufacturing the circuit of the circuit board. FIG. 7I is a top view of the circuit of the circuit board. In FIG. 7A, the step forms at least one via 701 in a carrier 70 by a laser process. In FIG. 7B, the step forms a first inner layer circuit 71 on an upper surface of the carrier, and forms a second inner layer circuit 72 on a bottom surface of the carrier 70. The first inner layer circuit 71 and the second inner layer circuit 72 are electrically connected to each other through the at least one via 701. In FIG. 7C, the step disposes a first upper dielectric layer 73 on the upper surface of the carrier 70, disposes a first bottom dielectric layer 74 on the bottom surface of the carrier 70, and further encapsulates the first inner layer circuit 71 and the second inner layer circuit 72. In FIG. 7D, the step forms at least one first upper blind hole 731 on the surface of the first upper dielectric layer 73 to expose a part of the first inner layer circuit 71, and forms at least one first bottom blind hole 741 on the surface of the first bottom dielectric layer 74 to expose a part of the second inner layer circuit 72. In FIG. 7E, the step forms a first upper circuit layer 75 on the surface of the first upper dielectric layer 73, and forms a first bottom circuit layer 76 on the surface of the first bottom dielectric layer 74. The first upper circuit layer 75 and the first bottom circuit layer 76 are electrically connected to each other through the at least one first upper blind hole 731, the at least one first bottom blind hole 741, the first inner layer circuit 71, and the second inner layer circuit 72. In FIG. 7F, a second upper dielectric layer 77, a second bottom dielectric layer 78, a second upper circuit layer 79 and a second bottom circuit layer 80 are separately formed. The second upper dielectric layer 77 is formed on the first upper dielectric layer 73. The second upper circuit layer 79 is formed on the second upper dielectric layer 77. The second bottom circuit layer 80 is formed on the second bottom dielectric layer 78. The second upper circuit layer 79 and the second bottom circuit layer 80 are electrically connected to each other through the first upper circuit layer 75 and the first bottom circuit layer 76. In FIG. 7G, the step forms a third upper dielectric layer 81, a third bottom dielectric layer 82, a third upper circuit layer 83 and a third bottom circuit layer 84. The third upper circuit layer 83 is formed on the third upper dielectric layer 81. The third bottom circuit layer 84 is formed on the third bottom As mentioned above, in the circuit board circuit structure 7, each dielectric layer is stacked on the upper surface and the bottom surface of the carrier 70 one by one, and encapsulates each circuit layer. However, the material of the general dielectric layer utilizes hybrid materials for the structural stiffness, such as epoxy resin, glass fiber or other filled materials. The materials have a high dielectric coefficient and a high dielectric loss coefficient so that the high frequency signal of the circuit layer transmitted in the carrier 70 is easily affected by the dielectric layer or the carrier 70 with the high dielectric coefficient and the high dielectric loss coefficient. Hence, the loss rate of the high frequency signal raises and the heat in the circuit board circuit structure 7 cannot be dissipated. Therefore, the development for the circuit board circuit structure 7 is not successful. The dielectric loss coefficient of the dielectric layer material is about 0.013.

Moreover, in the conventional circuit board circuit structure 7, the circuit board circuit structure 7 is a multi-layer stacked structure. That is, the stacked circuit board circuit structure 7 is deep in size. Therefore, when a part of the circuit in the multi-layer stacked structure fails or has process errors, the problem will be accumulated in each layer if a part of the poor circuit in the multi-layer stacked structure cannot be removed. Consequently, the process yield of the circuit board circuit structure 7 will be affected.

Accordingly, how to provide a method of circuit signal enhancement of a circuit board and a structure thereof to solve the problems mentioned above is an urgent subject to tackle.

SUMMARY OF THE INVENTION

In view of this, the present invention provides a circuit signal enhancement method of a circuit board. The circuit signal enhancement method comprises the following steps: forming a first signal transmission circuit layer with a first substrate body on a core layer upper surface of a core layer, and forming a second signal transmission circuit layer with a second substrate body on a core layer bottom surface of the core layer; forming a first signal enhancement circuit layer on the first substrate surface of the first substrate body, and forming a second signal enhancement circuit layer on the second substrate surface of the second substrate body; wherein the first signal enhancement circuit layer has a first dielectric coefficient less than a dielectric coefficient of the first substrate body, and a first dielectric loss coefficient of the first signal enhancement circuit layer is less than a dielectric loss coefficient of the first substrate body; wherein the second signal enhancement circuit layer has a second dielectric coefficient less than a dielectric coefficient of the second substrate body, and a second dielectric loss coefficient of the second signal enhancement circuit layer is less than a dielectric loss coefficient of the second substrate body; forming a third signal transmission circuit layer with a third substrate body on the upper surface of the carrier, and forming a fourth substrate body with a fourth signal transmission circuit layer on the carrier bottom surface of the carrier; separating the third substrate body from the carrier and separating the fourth substrate body from the carrier; combining the first signal enhancement circuit layer and the third signal transmission circuit layer of the third substrate body, and combining the second signal enhancement circuit layer and the fourth signal transmission circuit layer of the fourth substrate body; wherein the first signal enhancement circuit layer is disposed around a part of the first signal transmission circuit layer, and the second signal enhancement circuit layer is disposed around a part of the second signal transmission circuit layer; wherein a part of the first signal transmission circuit layer, the second signal transmission circuit layer, the third signal transmission circuit layer, and the fourth signal transmission circuit layer are electrically connected to each other to form the circuit signal enhancement structure of the circuit board.

The present invention further provides a circuit signal enhancement structure of the circuit board, and the circuit signal enhancement structure comprises a core layer, a first substrate body, a second substrate body, a first signal enhancement circuit layer, a second signal enhancement circuit layer, a third substrate body, and a fourth substrate body. The first substrate body comprises a first signal transmission circuit layer, and the first signal transmission circuit layer is disposed on the upper surface of the core layer. The second substrate body comprises a second signal transmission circuit layer, and the second signal transmission circuit layer is disposed on the bottom surface of the core layer. The first signal enhancement circuit layer is disposed around a part of the first signal transmission circuit layer. The second signal enhancement circuit layer is disposed around a part of the second signal transmission circuit layer. The third substrate body is disposed on the first substrate body and has the third signal transmission circuit layer. The fourth substrate body is disposed on the second substrate body and has the fourth signal transmission circuit layer. The first signal transmission circuit layer, the second signal transmission circuit layer, the third signal transmission circuit layer, and the fourth signal transmission circuit layer are partially electrically connected to each other. The first signal enhancement circuit layer has a first dielectric coefficient less than a dielectric coefficient of the first substrate body, and a first dielectric loss coefficient of the first signal enhancement circuit layer is less than a dielectric loss coefficient of the first substrate body. The second signal enhancement circuit layer has a second dielectric coefficient less than a dielectric coefficient of the second substrate body, and a second dielectric loss coefficient of the second signal enhancement circuit layer is less than a dielectric loss coefficient of the second substrate body.

As mentioned above, the circuit signal enhancement method of the circuit board and the circuit signal enhancement structure of the present invention dispose the signal enhancement layer with the low dielectric coefficient and the low dielectric loss coefficient on the predetermined circuit transmission path to both reduce the loss rate of the high frequency signal transmitted and dissipate heat in the carrier circuit. Moreover, the circuit signal enhancement method of the circuit board and the circuit signal enhancement structure thereof of the present invention manufacture an asymmetric coreless carrier by dividing the carrier to dispose each substrate body on the different substrate. Consequently, the whole volume of the circuit board and the circuit signal enhancement structure can be miniaturized. In addition, the circuit signal enhancement method detects the circuits of the circuit board to remove the poor circuit so that the process yield of the circuit board circuit structure can be improved.

DETAILED DESCRIPTION OF THE INVENTION

A circuit signal enhancement method of a circuit board of the present invention comprises the following steps:

step S11, forming a first signal transmission circuit layer with a first substrate body on an upper surface of a core layer, and forming a second signal transmission circuit layer with a second substrate body on a bottom surface of the core layer;

step S12, forming a first signal enhancement circuit layer on a surface of the first substrate body, and forming a second signal enhancement circuit layer on a surface of the second substrate body; wherein a dielectric coefficient of the first signal enhancement circuit layer is less than a dielectric coefficient of the first substrate body, a dielectric coefficient of the second signal enhancement circuit layer both is less than a dielectric coefficient of the second substrate body, a dielectric loss coefficient of the first signal enhancement circuit layer is less than a dielectric loss coefficient of the first substrate body and a dielectric loss coefficient of the second signal enhancement circuit layer both is less than a dielectric loss coefficient of the second substrate body;

step S13, forming a third signal transmission circuit layer with a third substrate body on the upper surface of the carrier, and forming a fourth signal transmission circuit layer with a fourth substrate body on the bottom surface of the carrier;

step S14, separating the third substrate body and the fourth substrate body from the carrier and removing the carrier;

step S15, combining the first signal transmission circuit layer of the first substrate body and the third signal transmission circuit layer of the third substrate body through the first signal enhancement circuit layer, and combining the second signal transmission circuit layer of the second substrate body and the fourth signal transmission circuit layer of the fourth substrate body through the second signal enhancement circuit layer; wherein the first signal enhancement circuit layer is encapsulated around the predetermined first signal transmission circuit layer, and the second signal enhancement circuit layer is encapsulated around the predetermined second signal transmission circuit layer; wherein the first signal transmission circuit layer, the second signal transmission circuit layer, the third signal transmission circuit layer, and the fourth signal transmission circuit layer are partially electrically connected to each other to form the circuit signal enhancement structure of the circuit board.

Figure 1A:
FIG. 1A to FIG. 1E are schematic views of forming a core layer, a first substrate body and a second substrate body of the present invention.
Figure 1B:
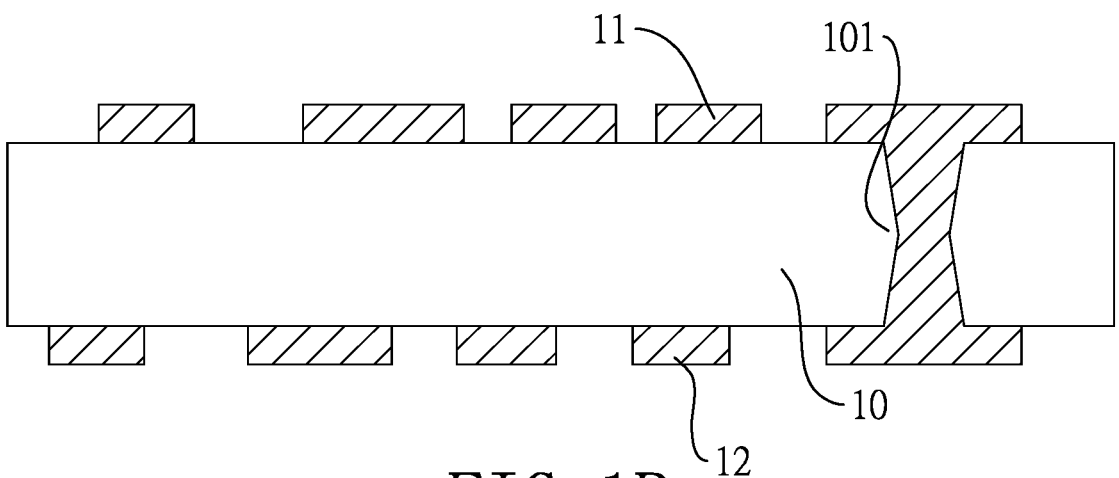
Figure 1C:
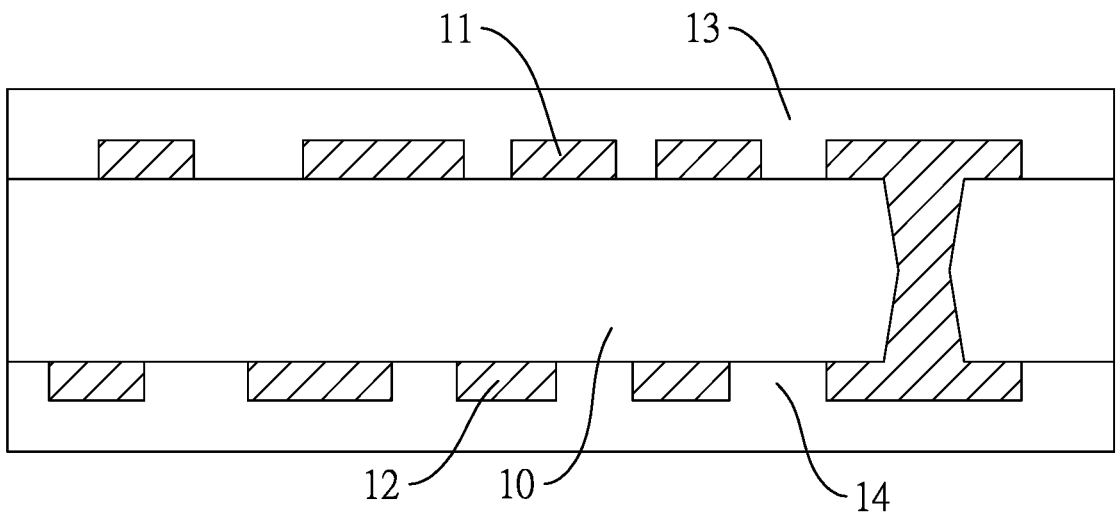
Figure 1D:
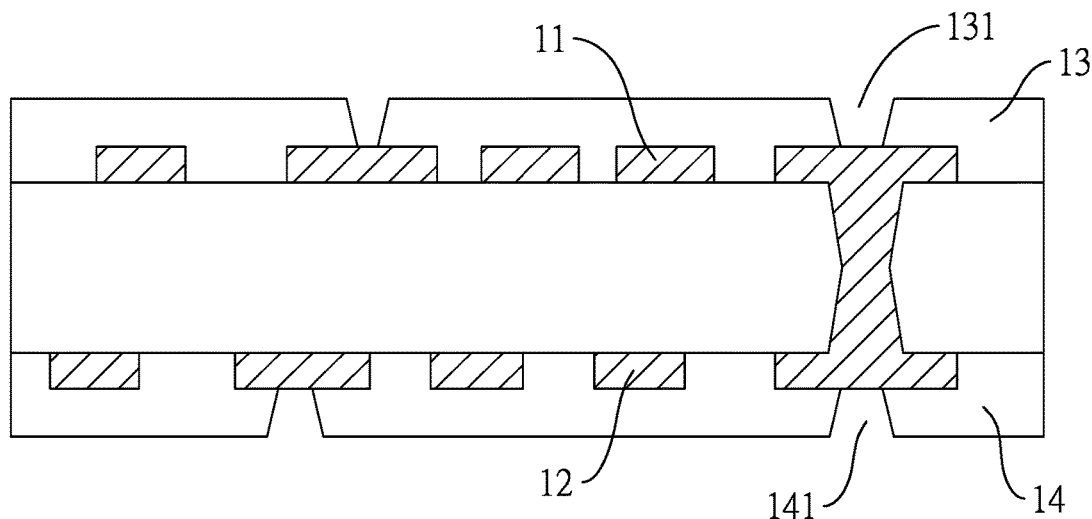
Figure 1E:
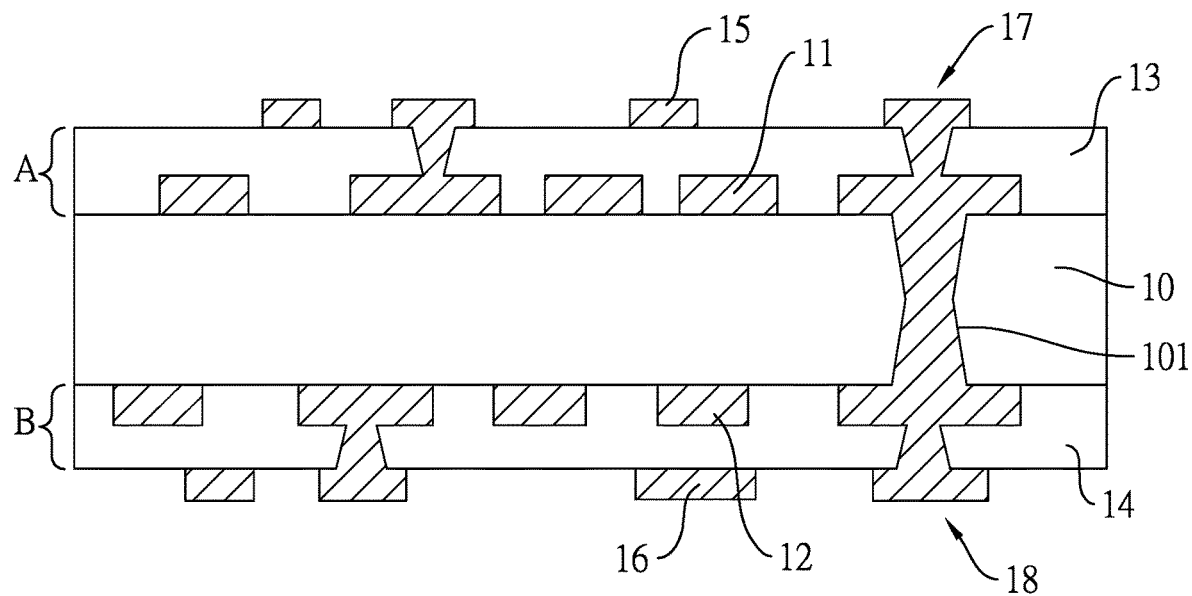

FIG. 1A to FIG. 1E are the schematic views of the step S11 for forming the core layer, the first substrate body and the second substrate body. As shown in FIG. 1A, the step S11 provides the core layer 10 and forms at least one via 101 in the core layer 10. As shown in FIG. 1B, the step S12 forms the first inner layer circuit 11 on the upper surface of the core layer 10, forms the second inner layer circuit 12 on the bottom surface of the core layer 10, and forms the first inner layer circuit 11 and the second inner layer circuit 12 in the at least one via 101. The first inner layer circuit 11 and the second inner layer circuit 12 are electrically connected to each other through the at least one via 101. As shown in FIG. 1C, the step S13 disposes the first dielectric layer 13 on the upper surface of the core layer 10, and disposes the second dielectric layer 14 on the bottom surface of the core layer 10. The first dielectric layer 13 and the second dielectric layer 14 encapsulate the first inner layer circuit 11 and the second inner layer circuit 12. As shown in FIG. 1D, the step S14 forms the at least one first blind hole 131 on the surface of the first dielectric layer 13 to partially expose the first inner layer circuit 11, and forms the at least one second blind hole 141 on the surface of the second dielectric layer 14 to partially expose the second inner layer circuit 12. As shown in FIG. 1E, the step S15 forms the first circuit layer 15 on the surface of the first dielectric layer 13 and in the at least one first blind hole 131, and forms the second circuit layer 16 on the surface of the second dielectric layer 14 and in the at least one second blind hole 141. The first circuit layer 15 and the second circuit layer 16 are partially electrically connected to each other through the at least one first blind hole 131, the at least one second blind hole 141, the first inner layer circuit 11, and the second inner layer circuit 12. The first circuit layer 15 and the second circuit layer 16 protrude from the at least one first blind hole 131 and the at least one second blind hole 141 to form the first signal transmission circuit layer 17 and the second signal transmission circuit layer 18. The first substrate body A comprises the structure on the upper surface of the core layer 10, and the second substrate body B comprises the structure on the bottom surface of the core layer 10. Furthermore, after the first substrate body A with the first signal transmission circuit layer 17 and the second substrate body B with the second signal transmission circuit layer 18 are respectively formed on the upper surface and the bottom surface of the core layer 10, a damaged circuit and the circuit with poor electric conductivity caused in the circuit of the core layer 10 can be detected for cutting to retain the excellent structure of the core layer 10.

Figure 2:
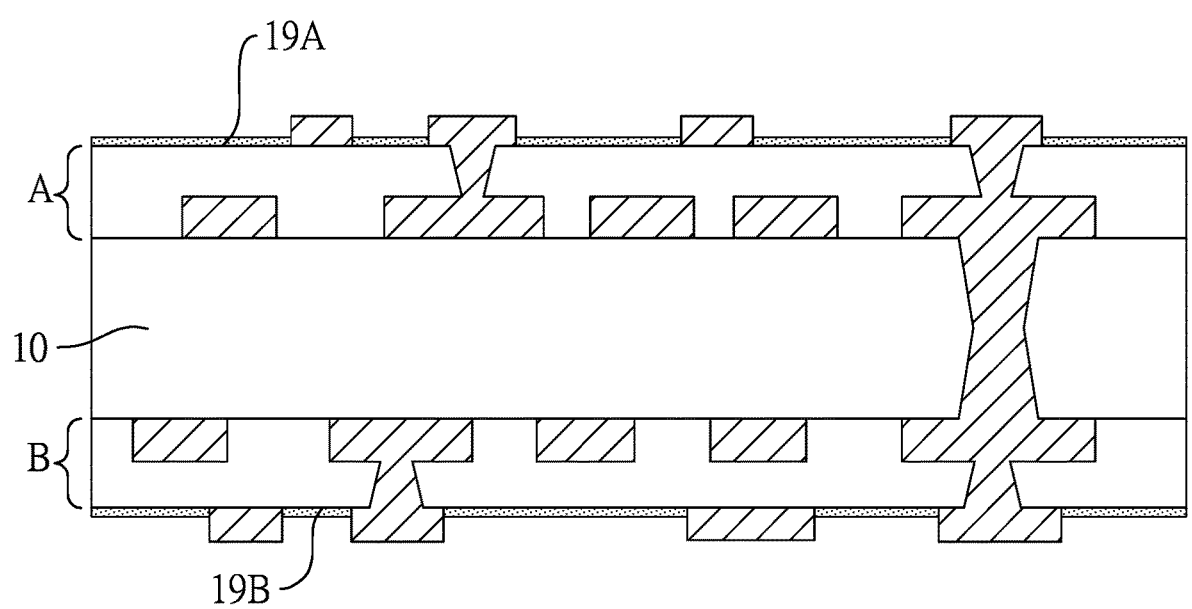
FIG. 2 is a cross sectional view of forming a first signal enhancement circuit layer and a second signal enhancement circuit layer on a surface of the first substrate body and a surface of the second substrate body.

Please refer to FIG. 2. FIG. 2 is the cross sectional view of the step S12 for separately forming the first signal enhancement circuit layer and the second signal enhancement circuit layer on the surface of the first substrate body and the surface of the second substrate body. As shown in FIG. 1E, after the first substrate body A and the second substrate body B are respectively formed on the upper surface and on the bottom surface of the core layer 10, the first signal enhancement circuit layer 19A is formed on the surface of the first substrate body A, and the second signal enhancement circuit layer 19B is formed on the surface of the second substrate body B.

Figure 3:
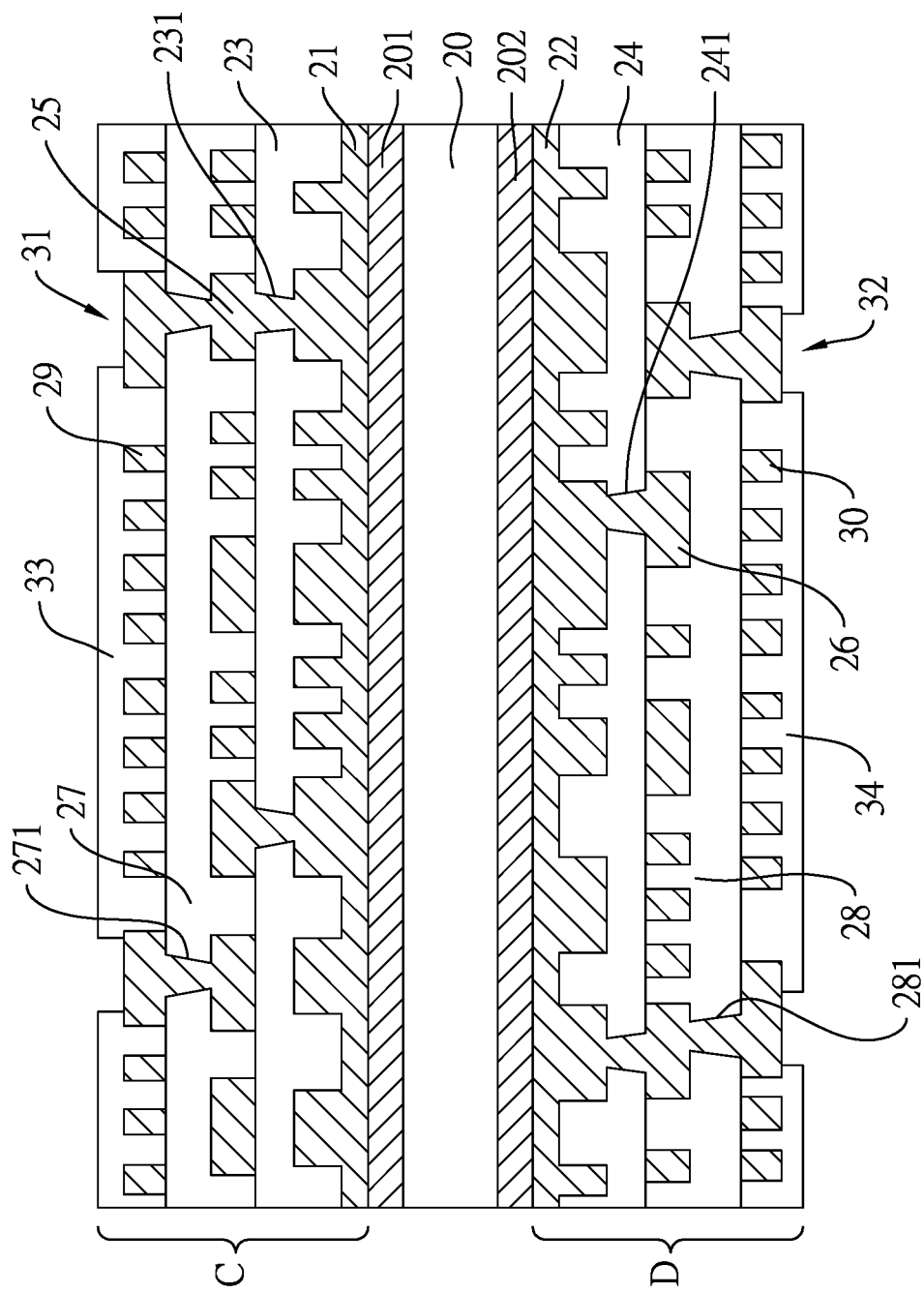
FIG. 3 is a cross sectional view of forming a carrier, a third substrate body and a fourth substrate body.

Please refer to FIG. 3. FIG. 3 is the cross sectional view of the step S13 for forming the carrier, the third substrate body and the fourth substrate body. The step S13 further comprises the following steps. In the step S130, the step S130 provides the carrier 20, wherein the carrier 20 has double-sided copper foil 201, 202, a resin base material. In the step S131, the step S131 forms a first release layer (not shown in the figure) on the upper surface of the carrier 20, and forms the second release layer (not shown in the figure) on the bottom surface of the carrier 20. In the step S132, the step S132 forms the first upper signal connection layer 21 on the first release layer, and forms the first bottom signal connection layer 22 on the second release layer. In the step S133, the step S133 disposes the first upper dielectric layer 23 on the first upper signal connection layer 21, disposes the first bottom dielectric layer 24 on the first bottom signal connection layer 22, and encapsulates the first upper signal connection layer 21 and the first bottom signal connection layer 22. In the step S134, the step S134 forms the at least one first upper blind hole 231 on the surface of the first upper dielectric layer 23, and forms the at least one first bottom blind hole 241 on the surface of the first bottom dielectric layer 24 to partially expose the first upper signal connection layer 21 and the first bottom signal connection layer 22. In the step S135, the step S135 forms the second upper circuit layer 25 on the surface of the first upper dielectric layer 23 and in the at least one first upper blind hole 231, and forms the second bottom circuit layer 26 on the surface of the first bottom dielectric layer 24 and in the at least one first bottom blind hole 241. In the step S136, the step S136 disposes the second upper dielectric layer on the surface of the first upper dielectric layer 23, disposes the second bottom dielectric layer 28 on the surface of the first bottom dielectric layer 24, and encapsulates the second upper circuit layer 25 and the second bottom circuit layer 26. In the step S137, the step S137 forms the at least one second upper blind hole 271 on the surface of the second upper dielectric layer 27, and forms the at least one second bottom blind hole 281 on the surface of the second bottom dielectric layer 28 to partially expose the second upper circuit layer 25 and the second bottom circuit layer 26. In the step S138, the step S138 forms the third upper circuit layer 29 on the surface of the second upper dielectric layer 27 and in the at least one second upper blind hole 271, and forms the third bottom circuit layer 30 on the surface of the second bottom dielectric layer 28 and in the at least one second bottom blind hole 281. The third upper circuit layer 29 is partially electrically connected to the second upper circuit layer 25 and the first upper signal connection layer 21 to form the third signal transmission circuit layer 31, and the third bottom circuit layer 30 is partially electrically connected to the second bottom circuit layer 26 and the first bottom signal connection layer 22 to form the fourth signal transmission circuit layer 32. In the step S139, the step S139 forms the first solder mask 33 on the surface of the second upper dielectric layer 27, and forms the second solder mask 34 on the surface of the second bottom dielectric layer 28 to partially expose the third upper circuit layer 29 and the third bottom circuit layer 30. The third substrate body C comprises the structure on the upper surface of the carrier 20, and the fourth substrate body D comprises the structures on the bottom surface of the carrier 20. It should be noted that in the embodiment of the invention, the third substrate body C on the upper surface of the carrier 20 and the fourth substrate body D disposed on the bottom surface of the carrier 20 are the multi-layer circuit board, the multiple layers of which (comprising a dielectric layer and a circuit layer) are an example for illustration, but the multiple layers are not limited to the three layers. Moreover, after the third substrate body C is formed on the upper surface of the carrier 20 and the fourth substrate body D is formed on the bottom surface of the carrier 20, a damaged circuit and the circuit with poor electric conductivity caused in the third substrate body C and fourth substrate body D can be detected for cutting to retain the excellent structure of the third substrate body C and the fourth substrate body D.

Figure 4A:
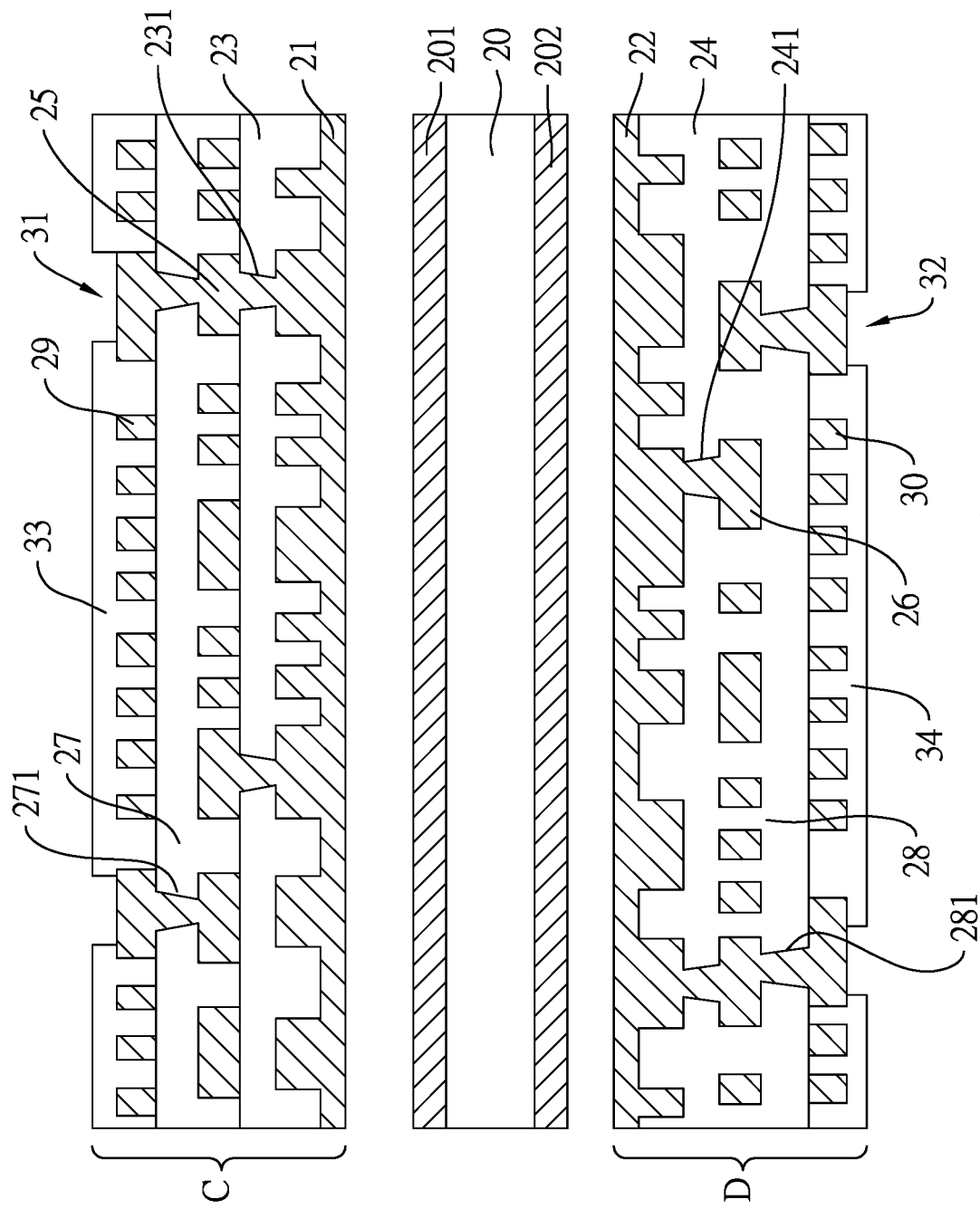
FIG. 4A to FIG. 4D are schematic views of separating the third substrate body and the fourth substrate body from the carrier.
Figure 4B:
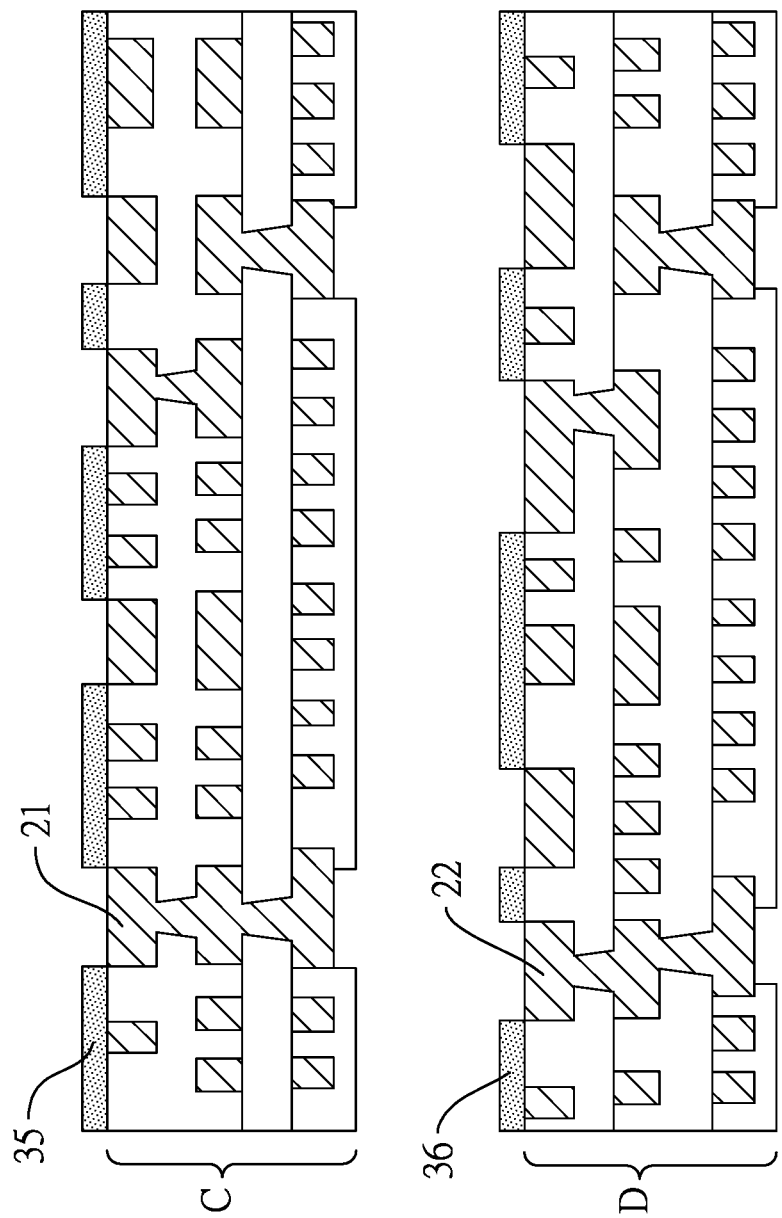
Figure 4C:
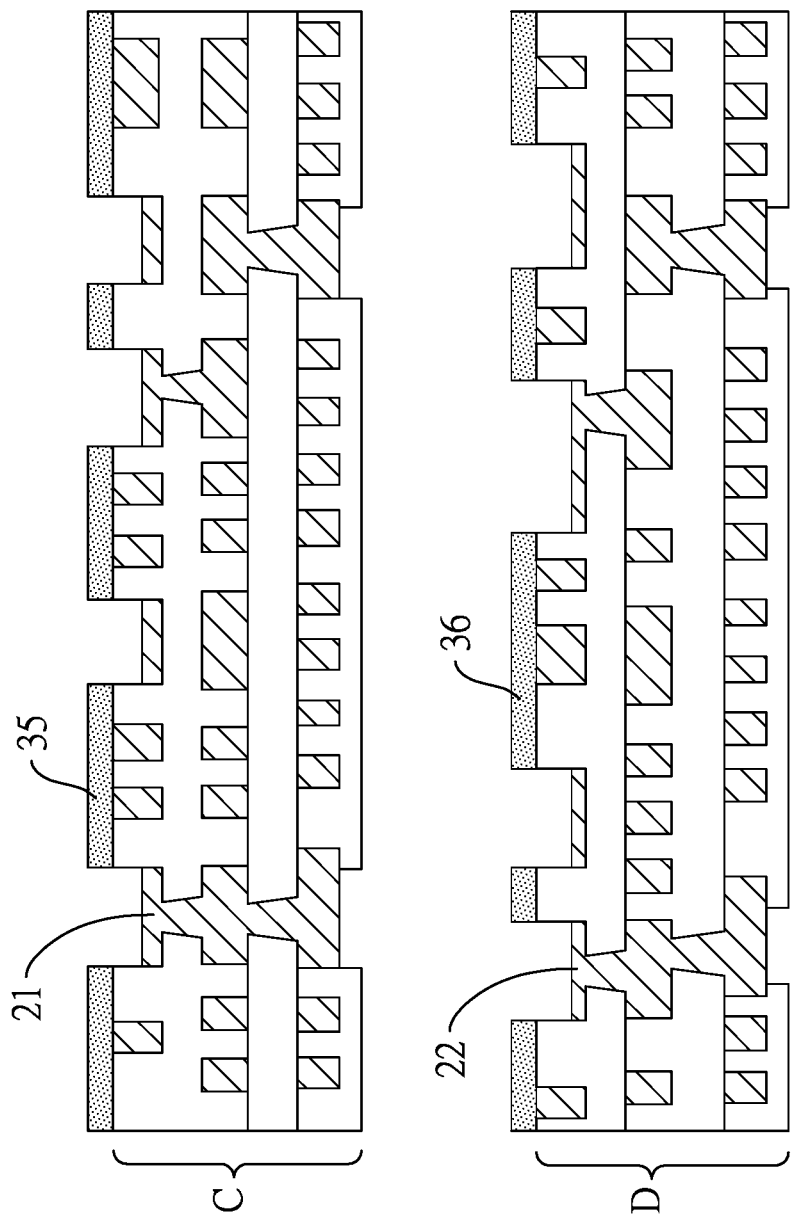
Figure 4D:
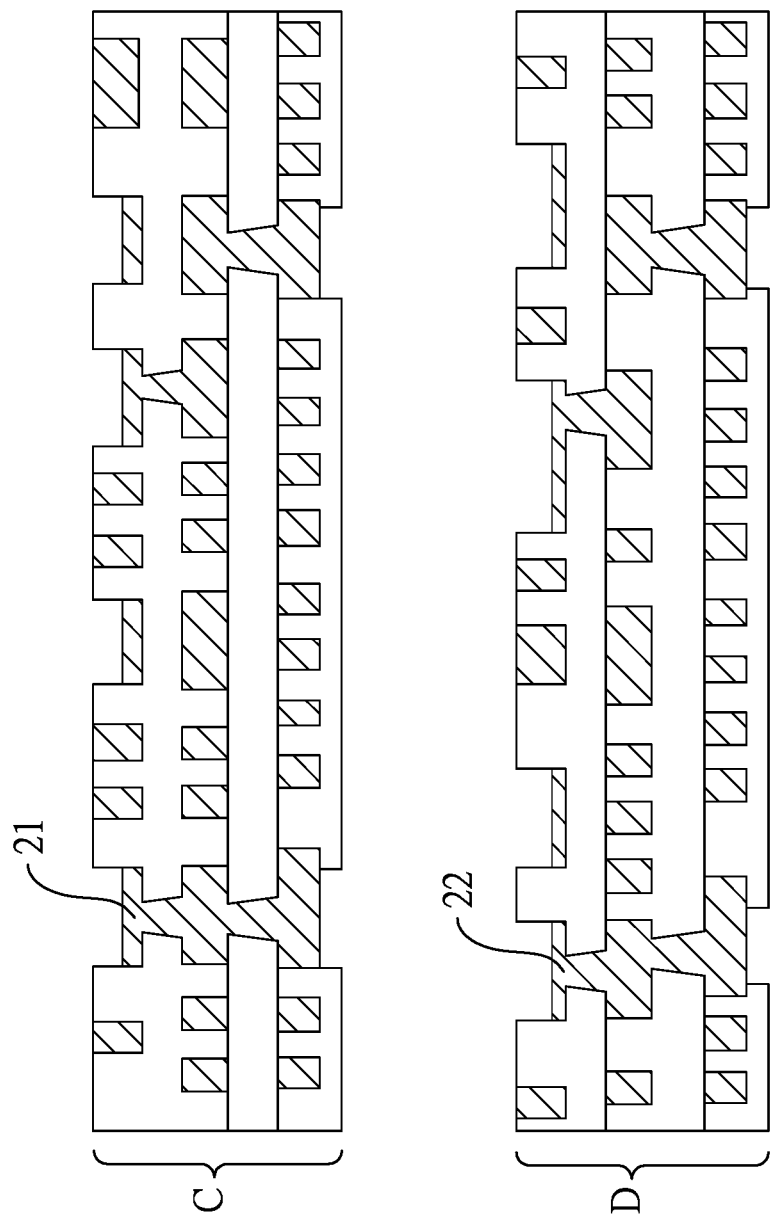

Please refer to FIG. 4A to FIG. 4D. FIG. 4A to FIG. 4D are the schematic views of the step S14 for separating the third substrate body from the carrier and separating the fourth substrate body from the carrier. The step S14 further comprises the following steps. As shown in FIG. 4A, the step S141 separates the third substrate body C from the carrier 20, and separates the fourth substrate body D from the carrier 20. As shown in FIG. 4B, the step S142 disposes the first protective layer 35 on the surface of the first upper signal connection layer 21, and disposes the second protective layer 36 on the surface of the first bottom signal connection layer 22. In an embodiment of the invention, the first protective layer 35 and the second protective layer 36 are anti-etch dry films. The first protective layer 35 is formed on the surface of the first upper signal connection layer 21 through the exposure developing to expose the positions of the first upper signal connection layer 21 to be etched. Similarly, the second protective layer 36 is formed on the surface of the first bottom signal connection layer 22 through the exposure developing to expose the positions of the first bottom signal connection layer 22 to be etched. As shown in FIG. 4C, the step S143 etches a part of the first upper signal connection layer 21 and a part of the first bottom signal connection layer 22. As shown in FIG. 4D, the step S144 removes the first protective layer 35 to form the third substrate body C and removes the second protective layer 36 to form the fourth substrate body D.

Figure 5A:
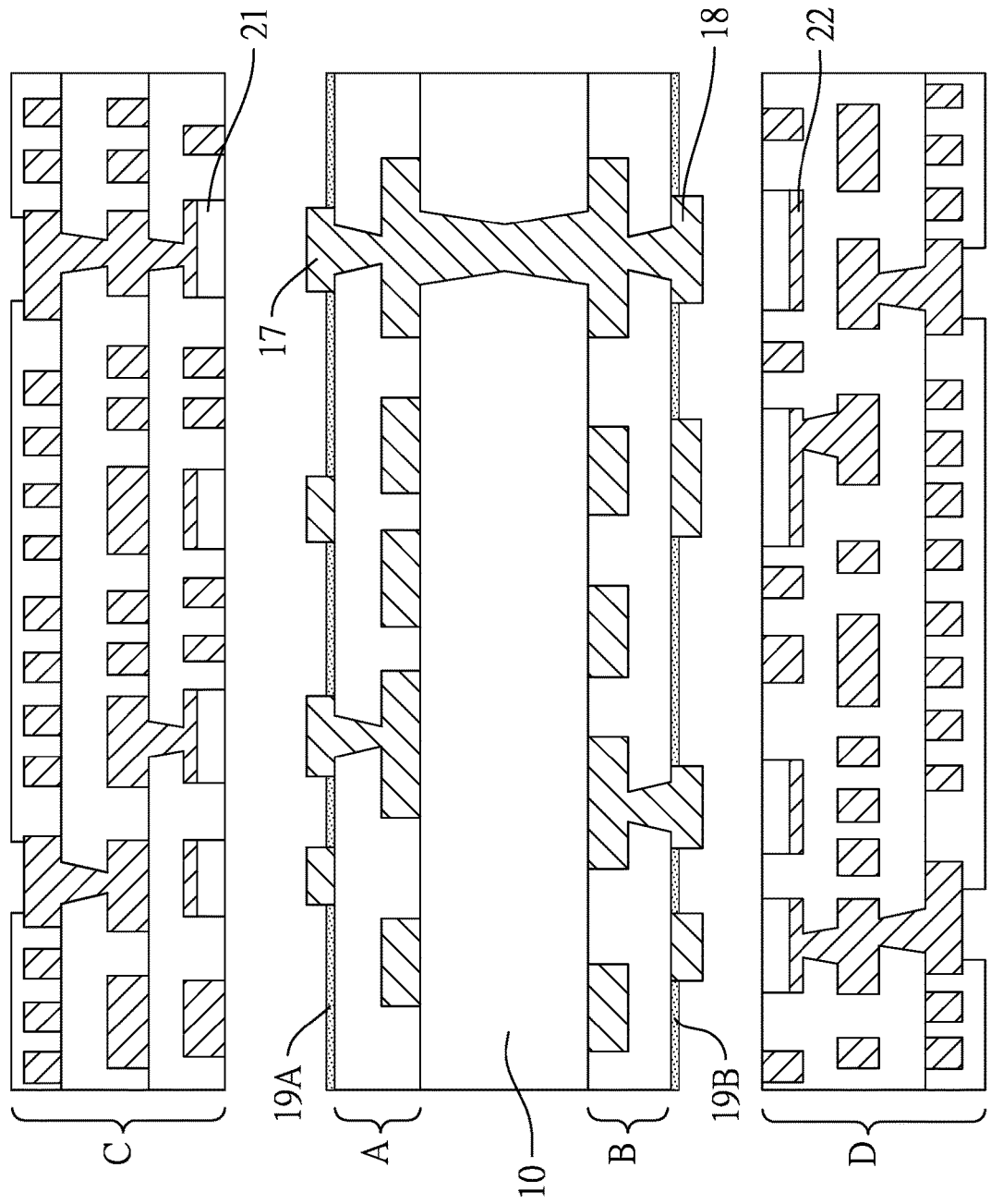
FIG. 5A to FIG. 5D are a combination of an exploded view, an assembly view, a partial enlargement view and a top view of completing the circuit signal enhancement structure of the circuit board of the present invention.
Figure 5B:
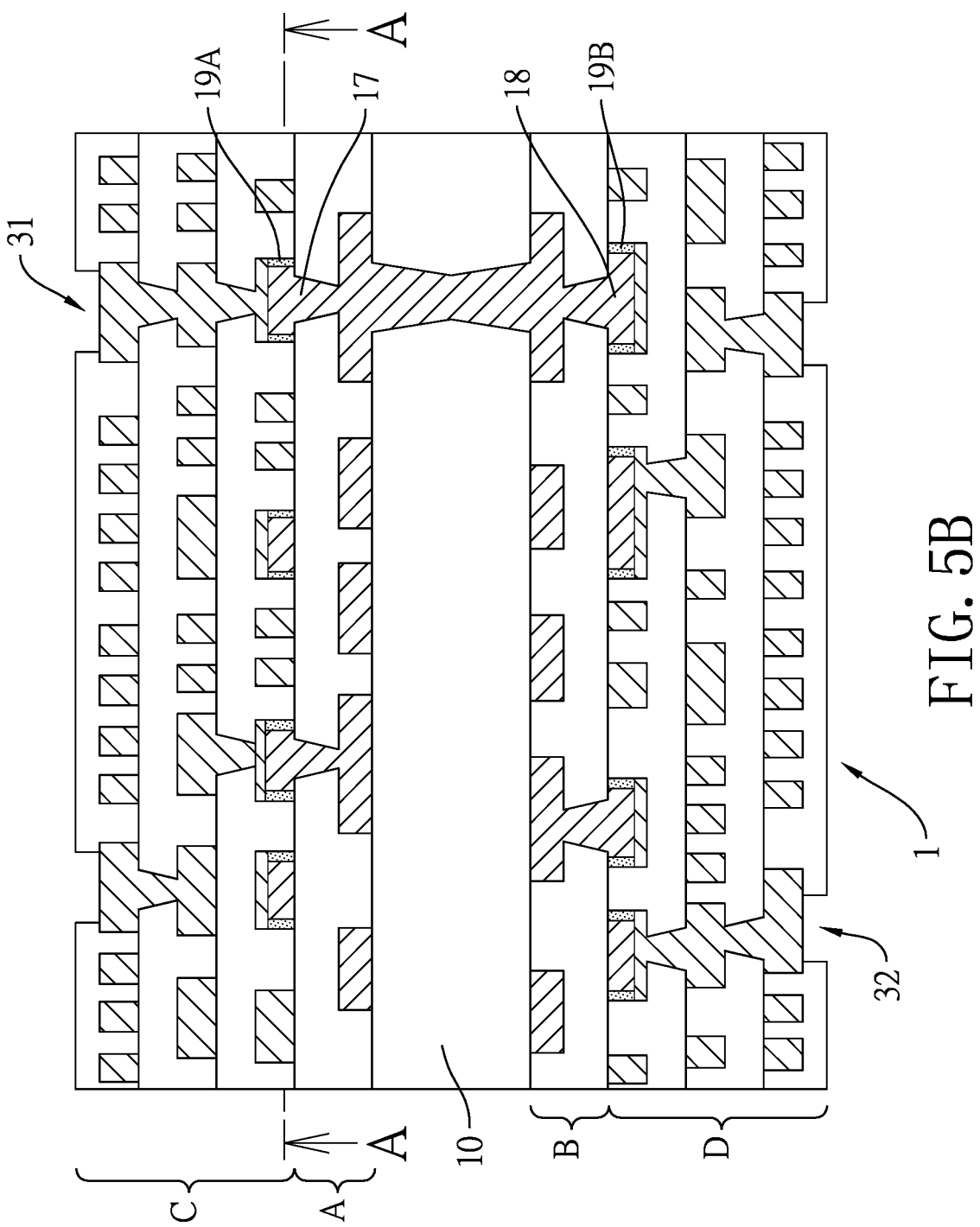
Figure 5C:
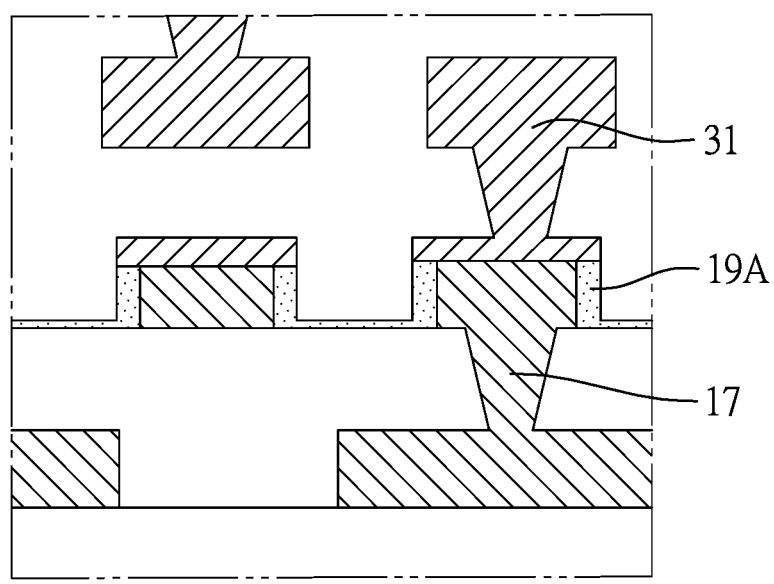
Figure 5D:
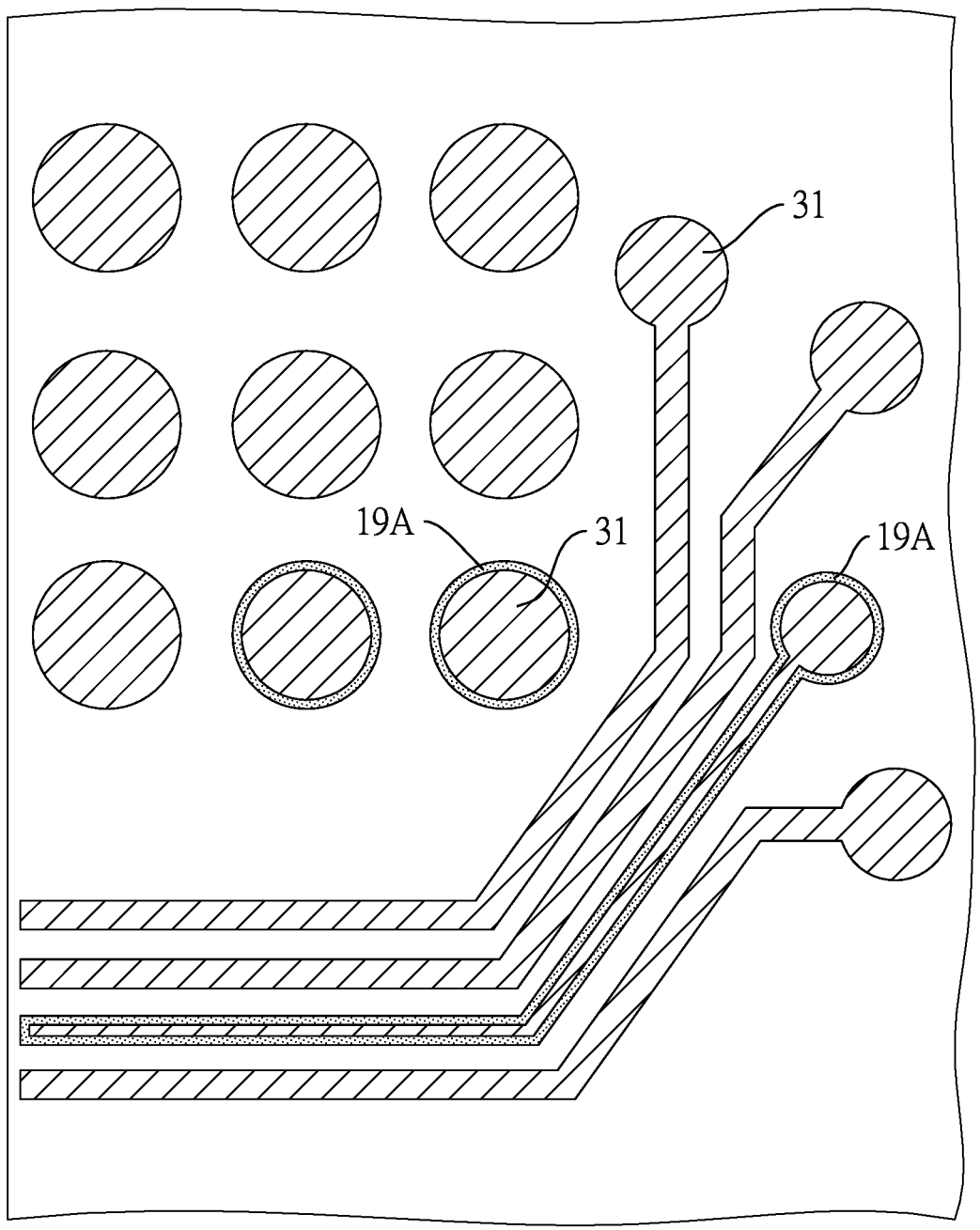

Please refer to FIG. 5A and FIG. 5D. FIG. 5A and FIG. 5D are the exploded view, the assembly view, the partial enlargement view and the top view of the step S15 for combining the circuit signal enhancement structure of the circuit board of the present invention. As shown in FIG. 5A and FIG. 5B, after the first substrate body A, the core layer 10, the second substrate body B, the third substrate body C and the fourth substrate body D are completed according to the above steps, the step S15 combines the first signal transmission circuit layer 17 of the first substrate body A and the third signal transmission circuit layer 31 of the third substrate body C through the first signal enhancement circuit layer 19A, and combines the second signal transmission circuit layer 18 of the second substrate body B and the fourth signal transmission circuit layer 32 of the fourth substrate body D through the second signal enhancement circuit layer 19B. That is, the third substrate body C is disposed on the first substrate body A, the first substrate body A is disposed on the upper surface of the core layer 10, the fourth substrate body D is disposed on the second substrate body B, and the second substrate body B is disposed on the bottom surface of the core layer 10. As shown in FIG. 5C, after combined, the first signal enhancement circuit layer 19A is encapsulated around the predetermined first signal transmission circuit layer 17 and the second signal enhancement circuit layer 19B is encapsulated around the predetermined second signal transmission circuit layer 18. In addition, the first signal transmission circuit layer 17, the second signal transmission circuit layer 18, the third signal transmission circuit layer 31, and the fourth signal transmission circuit layer 32 are partially electrically connected to each other to form the circuit signal enhancement structure of the circuit board 1.

Please refer to FIG. 5D again. It should be noted that the step disposes the first signal enhancement circuit layer 19A to encapsulate areas around the first signal transmission circuit layer 17 and disposes the second signal enhancement circuit layer 19B to encapsulate areas around the second signal transmission circuit layer 18 according to the predetermined signal transmission path. But the step fails to encapsulate the whole first signal transmission circuit layer 17 or encapsulate the whole second signal transmission circuit layer 18 to reduce the loss in the circuit transmission path.

In an embodiment of the invention, the first signal enhancement circuit layer 19A and the second signal enhancement circuit layer 19B are the glue material. In an embodiment of the invention, the dielectric coefficient of the glue material is less than or equal to 2, and the dielectric loss coefficient of the glue material is less than or equal to 0.002. The glue material comprises epoxy resin and so on. The step combines the first signal transmission circuit layer 17 and first the upper signal connection layer 21 by compressing the first substrate body A and the third substrate body C, and combines the second signal transmission circuit layer 18 and the first bottom signal connection layer 22 by compressing the second substrate body B and the fourth substrate body D. In detail, as shown in FIG. 4C, after a part of the first upper signal connection layer 21 and a part of the first bottom signal connection layer 22 are etched, the step S143 forms a recess structure. In FIG. 1E, the first circuit layer 15 protrudes from the first blind hole 131 and the second circuit layer 16 protrudes from the second blind hole 141. Hence, when the step combines the first signal transmission circuit layer 17 of the first substrate body A with the third signal transmission circuit layer 31 of the third substrate body C through the first signal enhancement circuit layer 19A, the step presses the first circuit layer 15 protruded from the first blind hole 131 to connect the first upper signal connection layer 21 in the recess structure. Similarly, when the step combines the second signal transmission circuit layer 18 of the second substrate body B with the fourth signal transmission circuit layer 32 of the fourth substrate body D through the second signal enhancement circuit layer 19B, the step presses the second circuit layer 16 protruded from the second blind hole 141 to connect the first bottom signal connection layer 22 in the recess structure. In addition, the step compresses the first signal enhancement circuit layer 19A disposed on the first substrate body A to the first upper signal connection layer 21 in the recess structure and encapsulates areas around the first circuit layer 15. Similarly, the step compresses the second signal enhancement circuit layer 19B disposed on the second substrate body B to the first bottom signal connection layer 22 in the recess structure and encapsulates areas around the second circuit layer 16.

Figure 6:
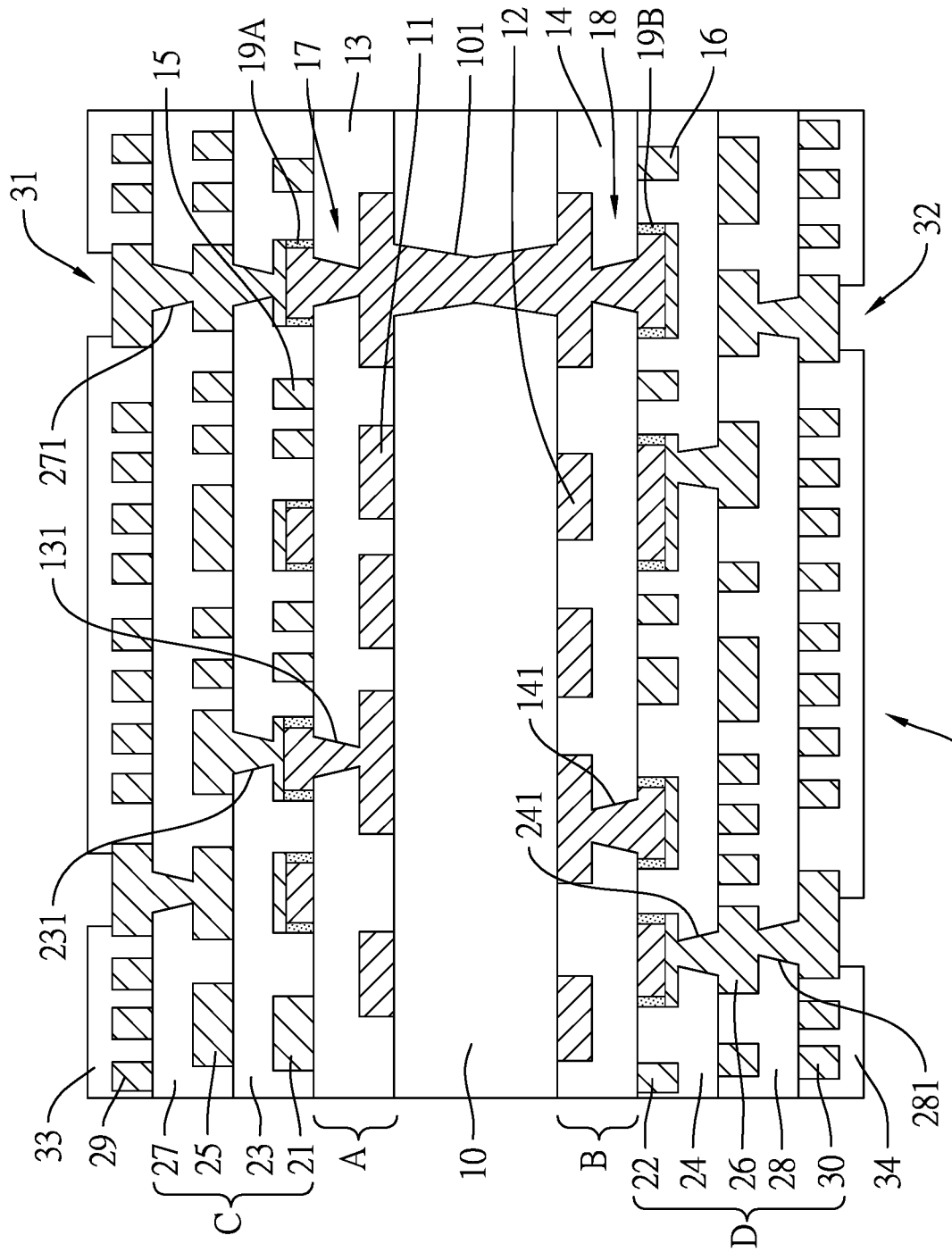
FIG. 6 is a cross sectional view of a circuit signal enhancement structure of a circuit board of the present invention.
Figure 7A:
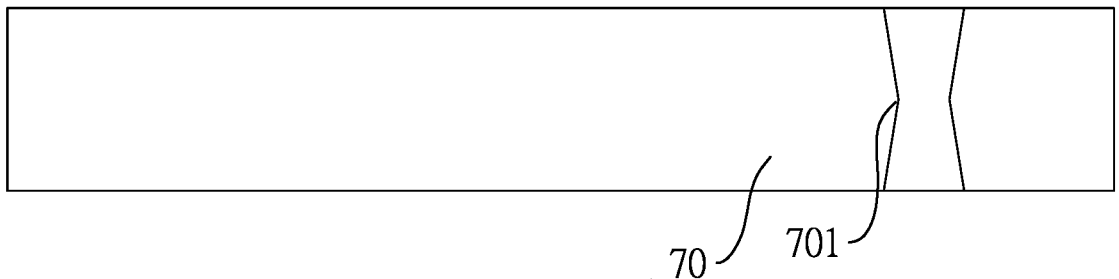
FIG. 7A to FIG. 7H are schematic views of manufacturing a conventional circuit board circuit.
Figure 7B:
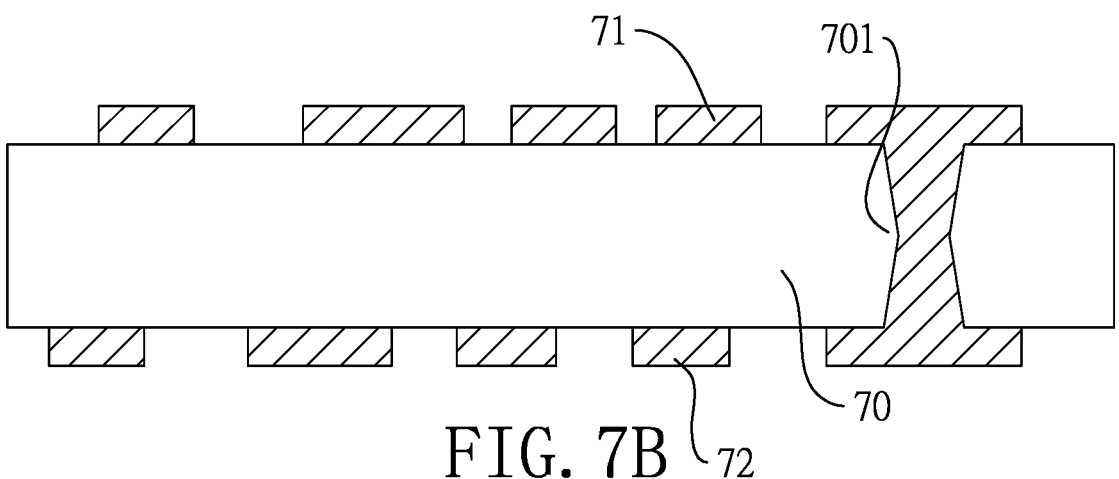
Figure 7C:
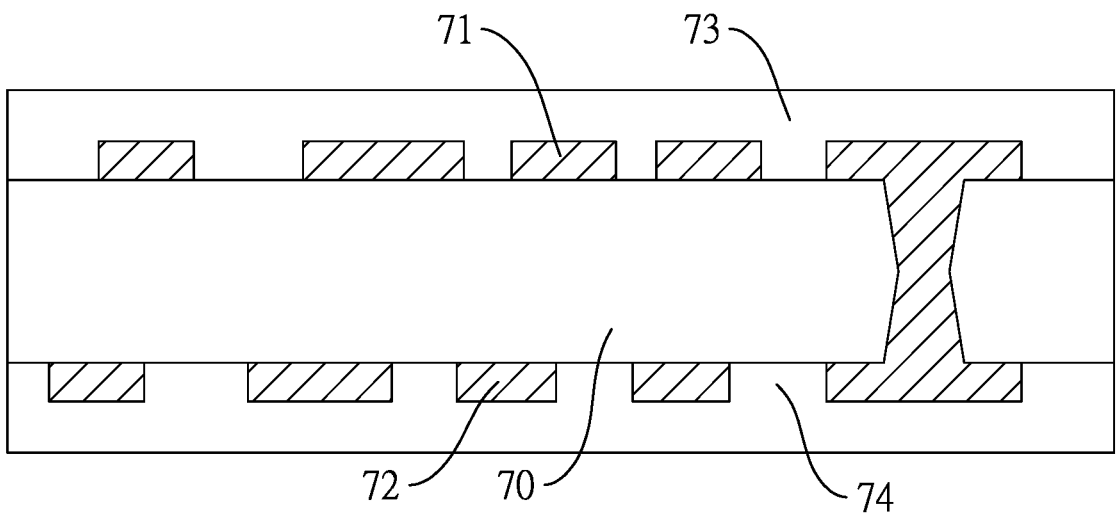
Figure 7D:
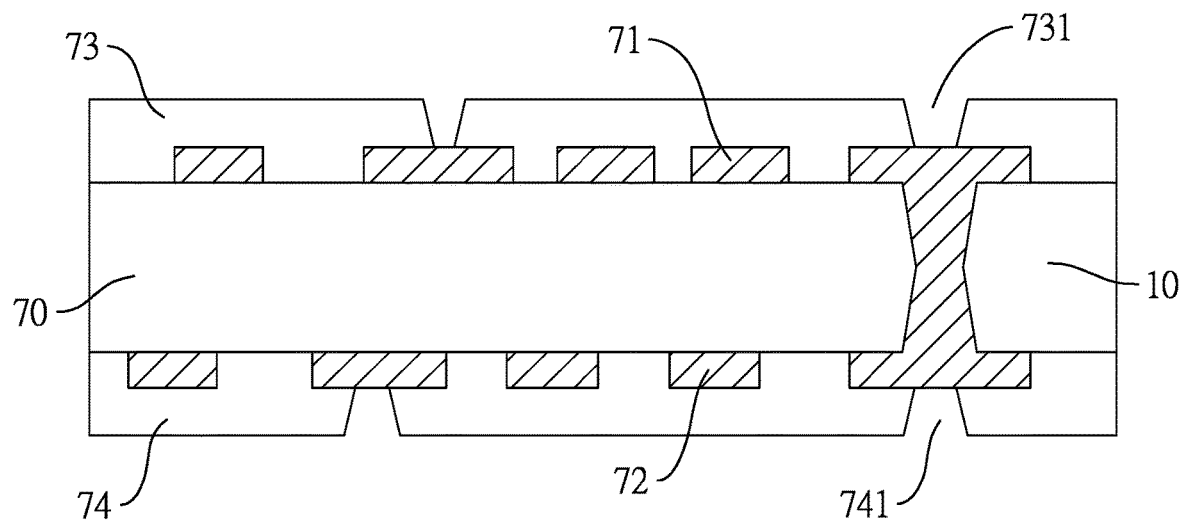
Figure 7E:
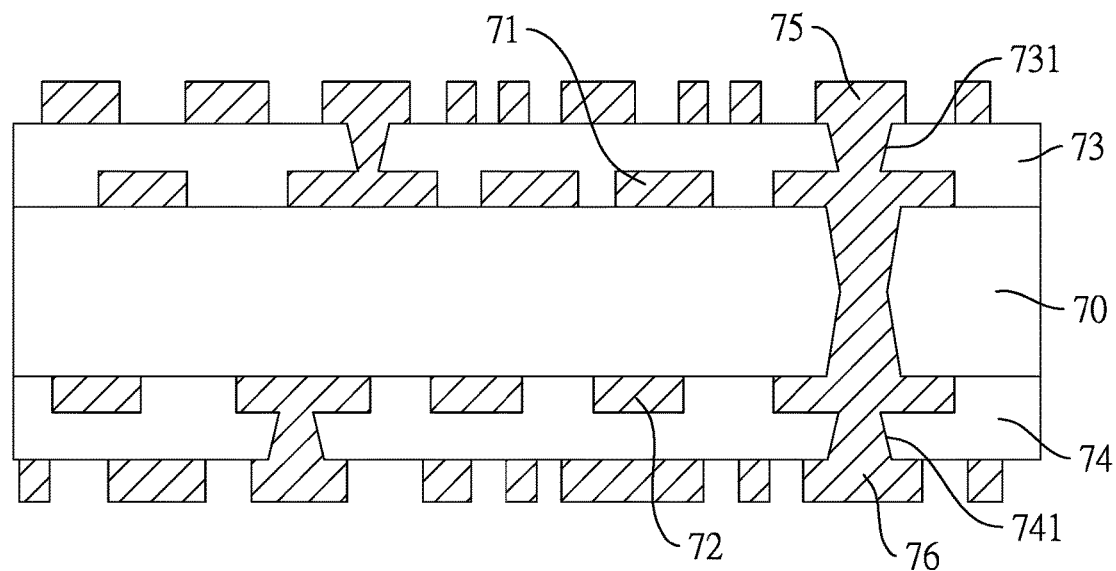
Figure 7F:
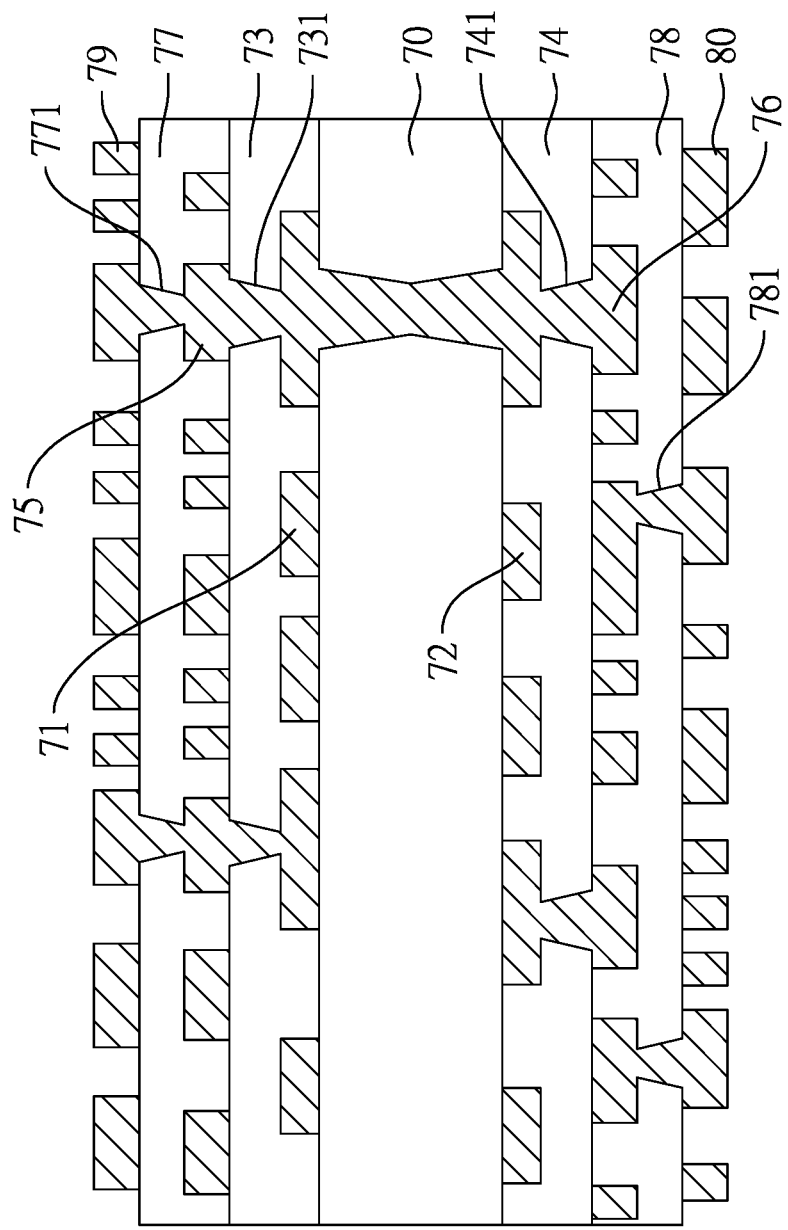
Figure 7G:
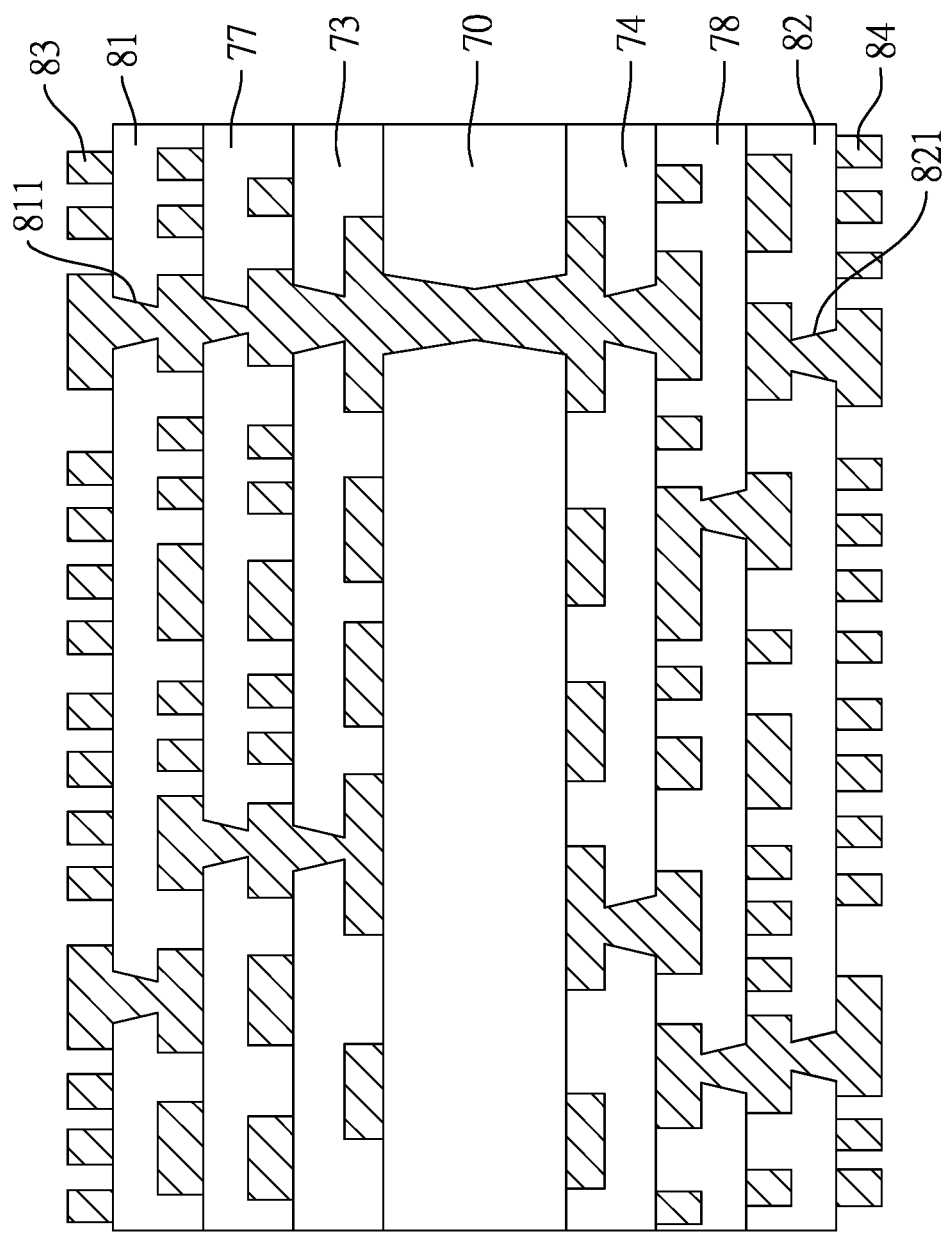
Figure 7H:
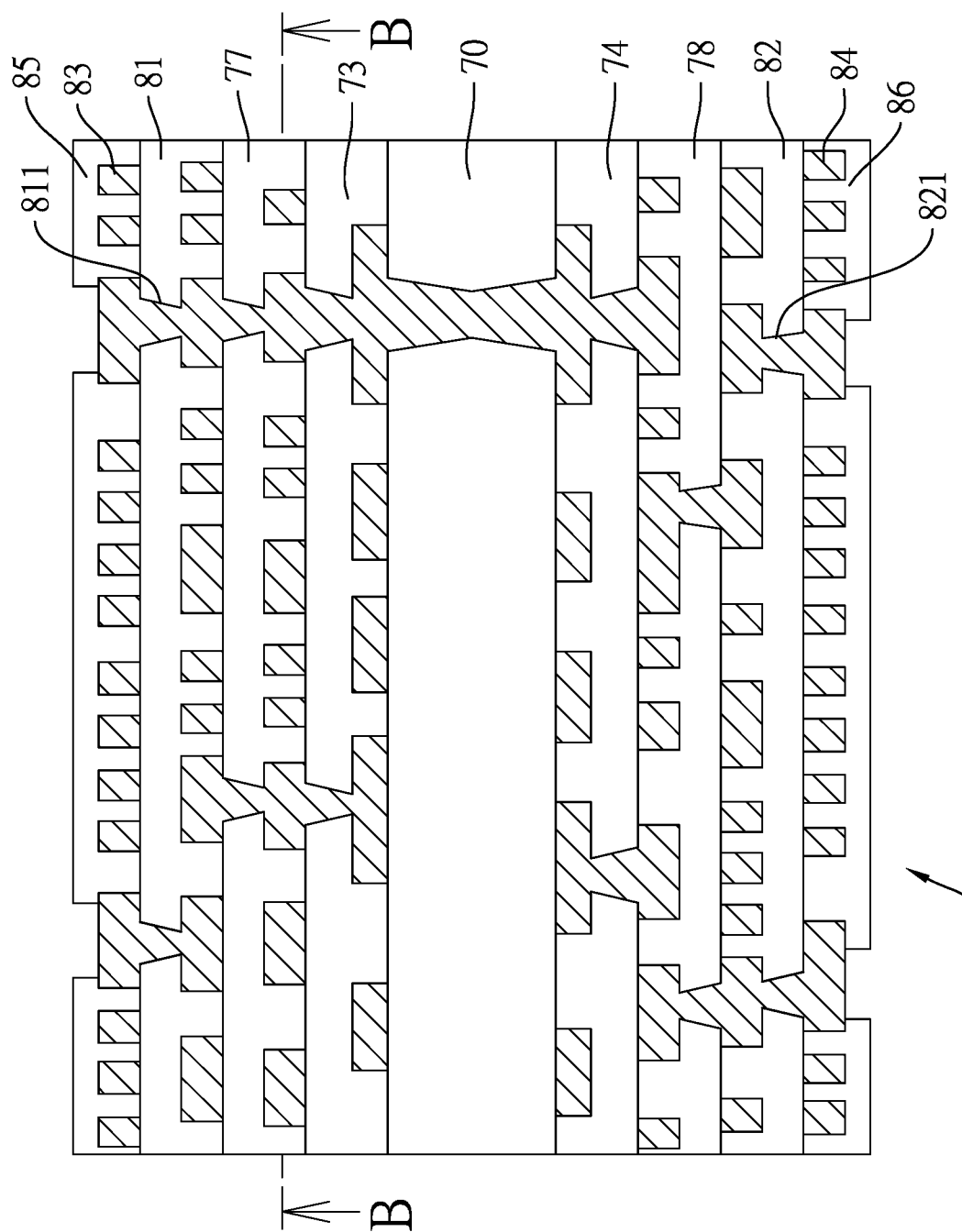
Figure 7I:
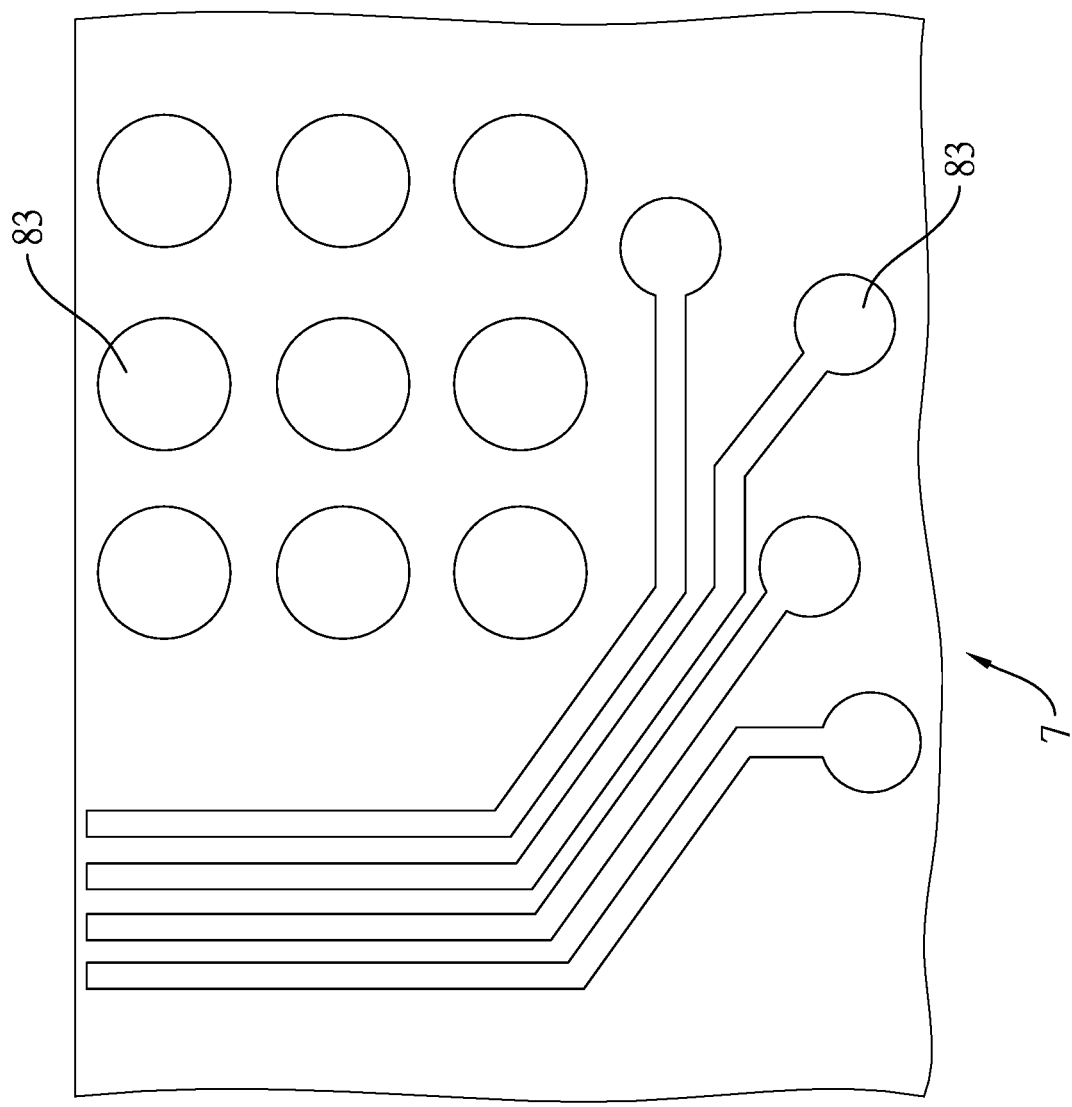
FIG. 7I is a top view of a conventional circuit board circuit structure.

Please refer to FIG. 6. FIG. 6 is the cross sectional view of the circuit signal enhancement structure of the circuit board of the present invention. The circuit signal enhancement structure of the circuit board 1 comprises a core layer 10, a first substrate body A, a second substrate body B, a first signal enhancement circuit layer 19A, a second signal enhancement circuit layer 19B, a third substrate body C, and a fourth substrate body D. The first substrate body A has the first signal transmission circuit layer 17. The first signal transmission circuit layer 17 is disposed on the upper surface of the core layer 10. The second substrate body B has the second signal transmission circuit layer 18. The second signal transmission circuit layer 18 is disposed on the bottom surface of the core layer 10. The first signal enhancement circuit layer 19A is disposed around a part of the first signal transmission circuit layer 17. The second signal enhancement circuit layer 19B is disposed around a part of the second signal transmission circuit layer 18. The third substrate body C is disposed on the first substrate body A and has the third signal transmission circuit layer 31. The fourth substrate body D is disposed on the second substrate body B and has the fourth signal transmission circuit layer 32. The first signal transmission circuit layer 17, the second signal transmission circuit layer 18, the third signal transmission circuit layer 31 and the fourth signal transmission circuit layer 32 are partially electrically connected to each other. The first signal enhancement circuit layer 19A has the dielectric coefficient less than the dielectric coefficient of the first substrate body A. The second signal enhancement circuit layer 19B has the dielectric coefficient less than the dielectric coefficient of the second substrate body B. The first signal enhancement circuit layer 19A has the dielectric loss coefficient less than the dielectric loss coefficient of the first substrate body A. The second signal enhancement circuit layer 19B has the dielectric loss coefficient less than the dielectric loss coefficient of the second substrate body B.

As shown in FIG. 6, the core layer 10 comprises at least one via 101, a first inner layer circuit 11, a second inner layer circuit 12, a first dielectric layer 13, a second dielectric layer 14, a first circuit layer 15, and a second circuit layer 16. The first inner layer circuit 11 is disposed on the upper surface of the core layer 10 and in the at least one via 101. The second inner layer circuit 12 is disposed on the bottom surface of the core layer 10 and in the at least one via 101. The first inner layer circuit 11 is electrically connected to the second inner layer circuit 12 through the at least one via 101. The first dielectric layer 13 is disposed on the upper surface of the core layer 10 and encapsulates the first inner layer circuit 11. The second dielectric layer 14 is disposed on the bottom surface of the core layer 10 and encapsulates the second inner layer circuit 12. The first circuit layer 15 is disposed on the surface of the first dielectric layer 13 and in the at least one first blind hole 131 of the first dielectric layer 13. The second circuit layer 16 is disposed on the surface of the second dielectric layer 14 and in the at least one second blind hole 141 of the second dielectric layer 14. The first circuit layer 15 and the second circuit layer 16 are electrically connected to each other through the at least one first blind hole 131, the at least one second blind hole 141, the first inner layer circuit 11 and the second inner layer circuit 12. The first circuit layer 15 and the second circuit layer 16 protrude from the at least one first blind hole 131 and the at least one second blind hole 141 to form the first signal transmission circuit layer 17 and the second signal transmission circuit layer 18.

As shown in FIG. 6. The third substrate body C comprises a first upper signal connection layer 21, a first upper dielectric layer 23, a second upper circuit layer 25, a second upper dielectric layer 27, a third upper circuit layer 29, and a first solder mask 33. One part of the first upper signal connection layer 21 is disposed on the surface of the first dielectric layer 13, and the other part of the first upper signal connection layer 21 is disposed on the first circuit layer 15. The first upper dielectric layer 23 is disposed on the first dielectric layer 13 and encapsulates the first upper signal connection layer 21, the first circuit layer 15 and the first signal enhancement circuit layer 19A. The second upper circuit layer 25 is disposed on the surface of the first upper dielectric layer 23 and in the at least one first upper blind hole 231 of the first upper dielectric layer 23. The second upper dielectric layer 27 is disposed on the surface of the first upper dielectric layer 23 and encapsulates the second upper circuit layer 25. The third upper circuit layer 29 is disposed on the surface of the second upper dielectric layer 27 and in the at least one second upper blind hole 271 of the second upper dielectric layer 27. The first solder mask 33 is disposed on the surface of the second upper dielectric layer 27 and exposes a part of the third upper circuit layer 29.

As shown in FIG. 6, the fourth substrate body D comprises a first bottom signal connection layer 22, a first bottom dielectric layer 24, a second bottom circuit layer 26, a second bottom dielectric layer 28, a third bottom circuit layer 30, and a second solder mask 34. One part of the first bottom signal connection layer 22 is disposed in the surface of the second dielectric layer 14 and the other part of the first bottom signal connection layer 22 is disposed on the second circuit layer 16. The first bottom dielectric layer 24 is disposed on the second dielectric layer 14, and encapsulates the first bottom signal connection layer 22, the second circuit layer 16 and the second signal enhancement circuit layer 19B. The second bottom circuit layer 26 is disposed on the surface of the first bottom dielectric layer 24 and in the at least one first bottom blind hole 241 of the first bottom dielectric layer 24. The second bottom dielectric layer 28 is disposed on the surface of the first bottom dielectric layer 24 and encapsulates the second bottom circuit layer 26. The third bottom circuit layer 30 is disposed on the surface of the second bottom dielectric layer 28 and in the at least one second bottom blind hole 281 of the second bottom dielectric layer 28. The second solder mask 34 is disposed on the surface of the second bottom dielectric layer 28, and exposes a part of the third bottom circuit layer 30. The third signal transmission circuit layer 31 is formed through the third upper circuit layer 29 electrically connected to the at least one second upper blind hole 271 and the second upper circuit layer 25. The fourth signal transmission circuit layer 32 is formed through the third bottom circuit layer 30 electrically connected to the at least one second bottom blind hole 281 and the second bottom circuit layer 26.

In an embodiment of the invention, the first signal enhancement circuit layer 19A and the second signal enhancement circuit layer 19B are the glue material. The dielectric coefficient of the glue material is less than or equal to 2, and the dielectric loss coefficient of the glue material is less than or equal 0.002.

In summary, the circuit signal enhancement method of the circuit board and the structure thereof of the present invention dispose the signal enhancement layer with the low dielectric coefficient and the low dielectric loss coefficient on the predetermined circuit transmission path to reduce the loss rate of the high frequency signal transmitted and dissipate heat in the carrier circuit. Moreover, the circuit signal enhancement method of the circuit board and the structure thereof of the present invention manufacture an asymmetric coreless carrier by dividing the carrier to dispose each substrate body on the different substrate. Consequently, the whole volume of the circuit board and the circuit signal enhancement structure can be miniaturized. In addition, the circuit signal enhancement method detects the circuits of the circuit board to remove the poor circuit so that the process yield of the circuit board circuit structure can be improved.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A circuit signal enhancement structure of a circuit board, comprising:
   a core layer;
   a first substrate body, having a first signal transmission circuit layer and disposed on a core layer upper surface of the core layer;
   a second substrate body, having a second signal transmission circuit layer and disposed on a core layer bottom surface of the core layer;
   a third substrate body, disposed on the first substrate body, and having a third signal transmission circuit layer and a first recess;
   a fourth substrate body, disposed on the second substrate body, and having a fourth signal transmission circuit layer and a second recess;
   a first signal enhancement circuit layer, disposed in the first recess, and partially disposed around a side of the first signal transmission circuit layer; wherein the first signal enhancement circuit layer has a first dielectric coefficient less than a dielectric coefficient of the first substrate body and a first dielectric loss coefficient less than a dielectric loss coefficient of the first substrate body;
   a second signal enhancement circuit layer, disposed in the second recess, and partially disposed around a side of the second signal transmission circuit layer; wherein the second signal enhancement circuit layer has a second dielectric coefficient less than a dielectric coefficient of the second substrate body and a second dielectric loss coefficient less than a dielectric loss coefficient of the second substrate body;
   wherein the first signal transmission circuit layer, the second signal transmission circuit layer, the third signal transmission circuit layer, and the fourth signal transmission circuit layer are partially electrically connected to each other.

2. The circuit signal enhancement structure of a circuit board as claimed in claim 1, wherein the core layer further comprises:
   at least one via;
   a first inner layer circuit, disposed on the core layer upper surface and in the at least one via;
   a second inner layer circuit, disposed on the core layer bottom surface and in the at least one via;
   a first dielectric layer, disposed on the core layer upper surface and encapsulating the first inner layer circuit;
   a second dielectric layer, disposed on the core layer bottom surface and encapsulating the second inner layer circuit;
   a first circuit layer, disposed on the first dielectric layer and in at least one first blind hole of the first dielectric layer; and
   a second circuit layer, disposed on the second dielectric layer and in at least one second blind hole of the second dielectric layer;
   wherein the first inner layer circuit and the second inner layer circuit formed in the at least one via are electrically connected to each other;
   wherein the first signal transmission circuit layer is formed by the first circuit layer and the first inner layer circuit;
   wherein the second signal transmission circuit layer is formed by the second circuit layer and the second inner layer circuit.

3. The circuit signal enhancement structure of a circuit board as claimed in claim 2, wherein the third substrate body comprises:
   a first upper signal connection layer, one part of the first upper signal connection layer disposed on the first dielectric layer surface and the other part of the first upper signal connection layer disposed on the first circuit layer;
   a first upper dielectric layer, disposed on the first dielectric layer and encapsulating the first upper signal connection layer, the first circuit layer and the first signal enhancement circuit layer;
   a second upper circuit layer, disposed on the first upper dielectric layer and in at least one first upper blind hole of the first upper dielectric layer;
   a second upper dielectric layer, disposed on the first upper dielectric layer and encapsulating the second upper circuit layer;
   a third upper circuit layer, disposed on the second upper dielectric layer and in at least one second upper blind hole of the second upper dielectric layer; and
   a first solder mask, disposed on the second upper dielectric layer to partially expose the third upper circuit layer;
   wherein the fourth substrate body comprises:
   a first bottom signal connection layer, one part of the first bottom signal connection layer disposed on the second dielectric layer and the other part of the first bottom signal connection layer disposed on the second circuit layer;
   a first bottom dielectric layer, disposed on the second dielectric layer and encapsulating the first bottom signal connection layer, the second circuit layer and the second signal enhancement circuit layer;
   a second bottom circuit layer, disposed on the first bottom dielectric layer and in the at least one first bottom blind hole of the first bottom dielectric layer;
   a second bottom dielectric layer, disposed on the first bottom dielectric layer and encapsulating the second bottom circuit layer;
   a third bottom circuit layer, disposed on the second bottom dielectric layer and in the at least one second bottom blind hole of the second bottom dielectric layer; and
   a second solder mask, disposed on the second bottom dielectric layer to partially expose the third bottom circuit layer;
   wherein the third signal transmission circuit layer is formed by the third upper circuit layer and the second upper circuit layer;
   wherein the fourth signal transmission circuit layer is formed by the third bottom circuit layer and the second bottom circuit layer.

4. The signal enhancement structure of a circuit of a circuit board as claimed in claim 1, wherein the first dielectric coefficient and the second dielectric coefficient are less than or equal to 2 and the first dielectric loss coefficient and the second dielectric loss coefficient are less than or equal to 0.002.

* * * * *